US010614974B2

(12) United States Patent
Bianco et al.

(10) Patent No.: US 10,614,974 B2
(45) Date of Patent: Apr. 7, 2020

(54) SWITCHING DEVICE

(71) Applicant: ABB Schweiz AG, Baden (CH)

(72) Inventors: Andrea Bianco, Sesto San Giovanni (IT); Carlo Boffelli, Dalmine (IT); Paolo Faure Ragani, Issime (IT); Roberto Penzo, Milan (IT)

(73) Assignee: ABB Schweiz AG, Baden (CH)

( * ) Notice: Subject to any disclaimer, the term of this patent is extended or adjusted under 35 U.S.C. 154(b) by 124 days.

(21) Appl. No.: 15/745,878

(22) PCT Filed: Jun. 16, 2016

(86) PCT No.: PCT/EP2016/063945
§ 371 (c)(1),
(2) Date: Jan. 18, 2018

(87) PCT Pub. No.: WO2017/005474
PCT Pub. Date: Jan. 12, 2017

(65) Prior Publication Data
US 2018/0218851 A1 Aug. 2, 2018

(30) Foreign Application Priority Data

Jul. 7, 2015 (EP) .................................... 15175633

(51) Int. Cl.
| H01H 9/30 | (2006.01) |
| H01H 9/54 | (2006.01) |
| H05K 1/02 | (2006.01) |
| H05K 1/18 | (2006.01) |
| H01H 9/56 | (2006.01) |

(52) U.S. Cl.
CPC ............... *H01H 9/30* (2013.01); *H01H 9/54* (2013.01); *H01H 9/542* (2013.01); *H01H 9/56* (2013.01);
(Continued)

(58) Field of Classification Search
USPC ........................................................ 307/113
See application file for complete search history.

(56) References Cited

U.S. PATENT DOCUMENTS

| 8,064,173 | B2 | 11/2011 | Frank |
| 2004/0090719 | A1 | 5/2004 | Larsson et al. |
| 2012/0285806 | A1* | 11/2012 | Boffelli ................. H01H 9/542 200/48 R |

FOREIGN PATENT DOCUMENTS

| EP | 2523203 A1 | 11/2012 |
| JP | H03129614 A | 6/1991 |
| WO | 0195354 A1 | 12/2001 |

OTHER PUBLICATIONS

European Patent Office, International Search Report & Written Opinion issued in corresponding Application No. PCT/EP2016/063945, dated Aug. 30, 2016, 12 pp.

(Continued)

*Primary Examiner* — Rexford N Barnie
*Assistant Examiner* — Xuan Ly
(74) *Attorney, Agent, or Firm* — Taft Stettinius & Hollister LLP; J. Bruce Schelkopf

(57) ABSTRACT

A switching device for low or medium voltage electric power distribution networks, the switching device comprising: at least an electric pole comprising a movable contact and a fixed contact, which are coupleable/decoupleable one to another; a circuit assembly, which comprises a chain of semiconductor devices adapted to switch in an ON state or in an OFF state depending on the voltage applied thereto, the semiconductor devices being electrically connected in series one to another in such a way that a current can flow according to a predefined conduction direction (CD) when the semiconductor devices are in an ON state. The circuit assembly comprises an input terminal, an output terminal and at least an intermediate terminal electrically connected (Continued)

Figure 1:
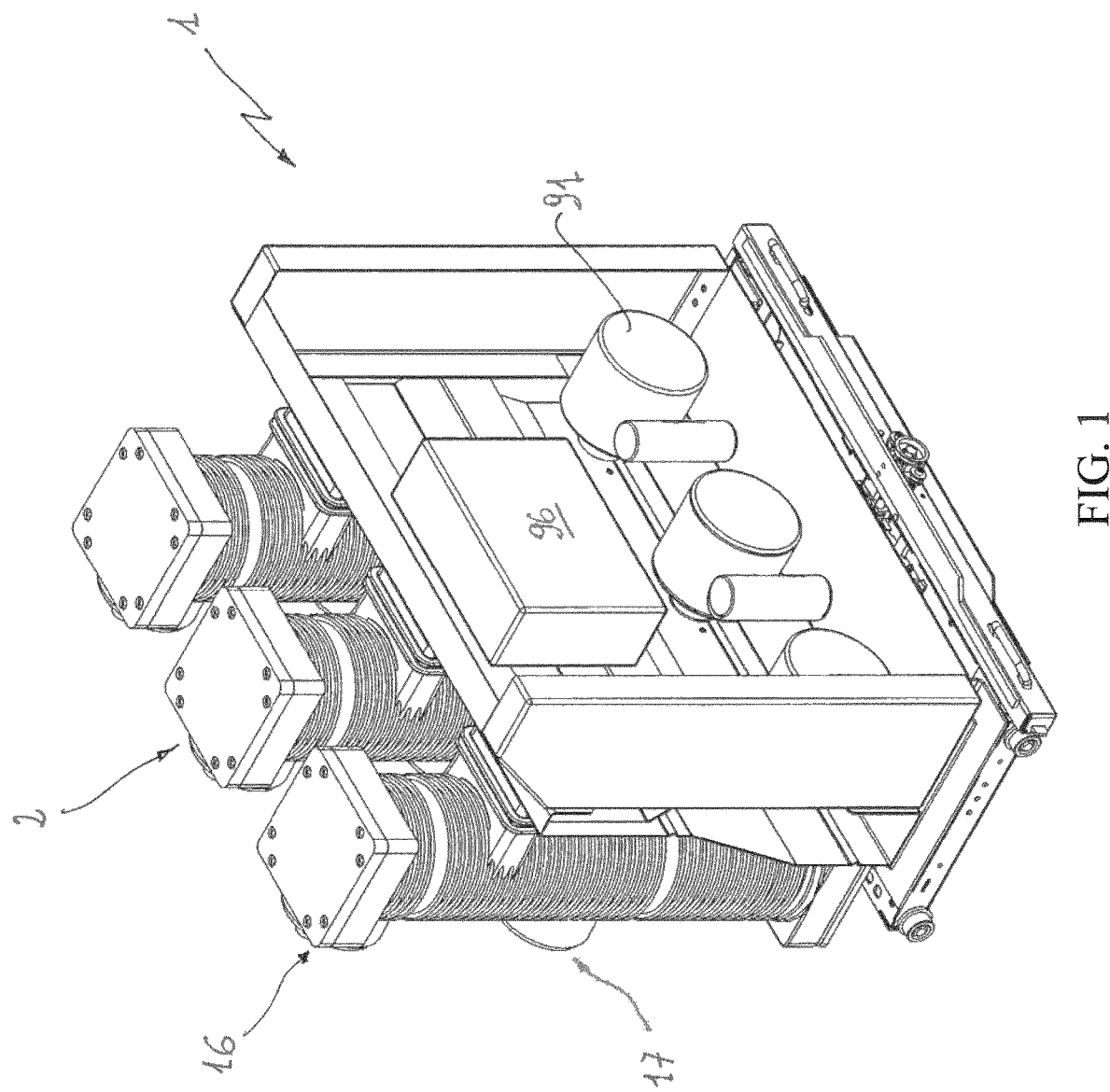
Figure 2:
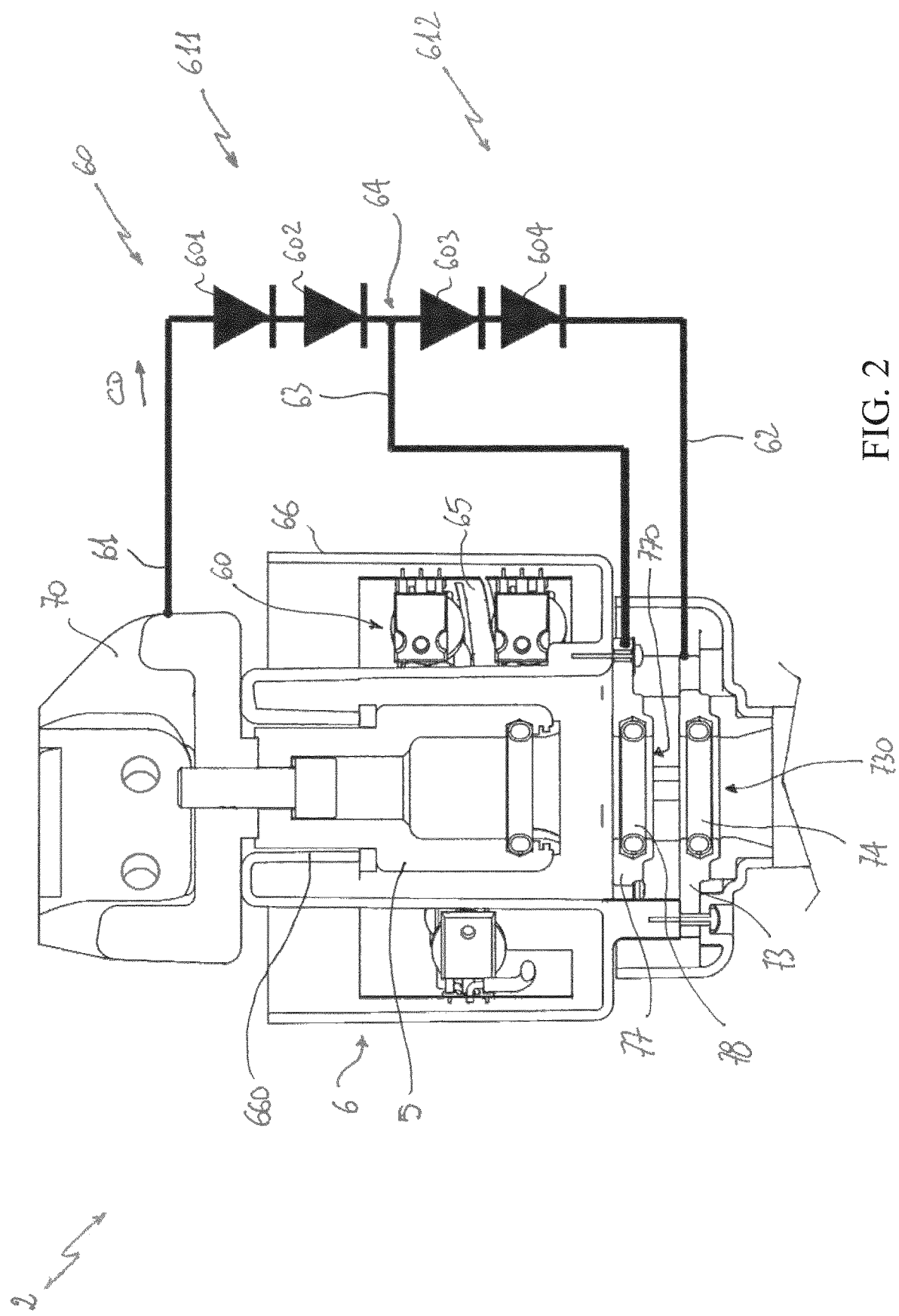
Figure 3:
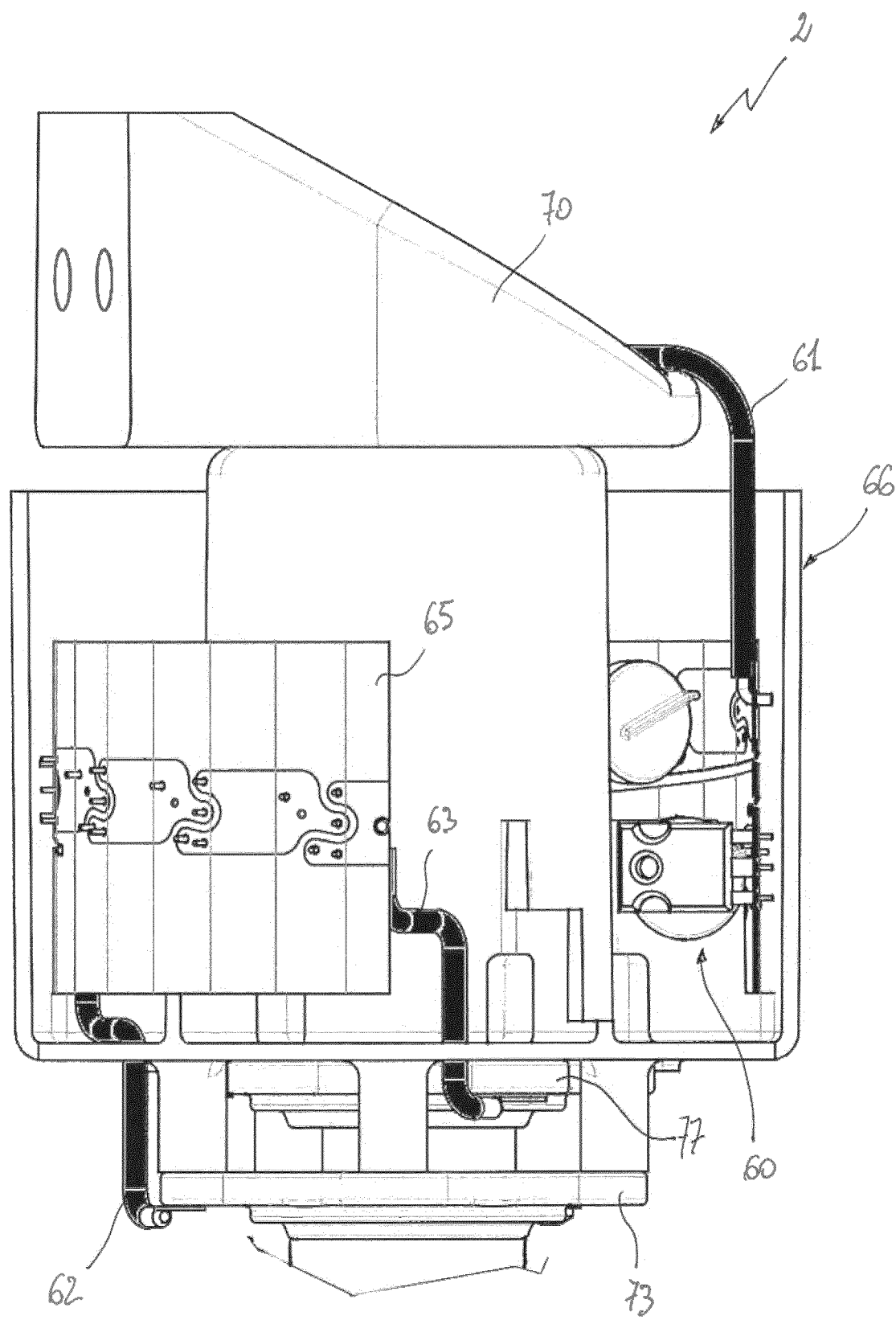
Figure 4:
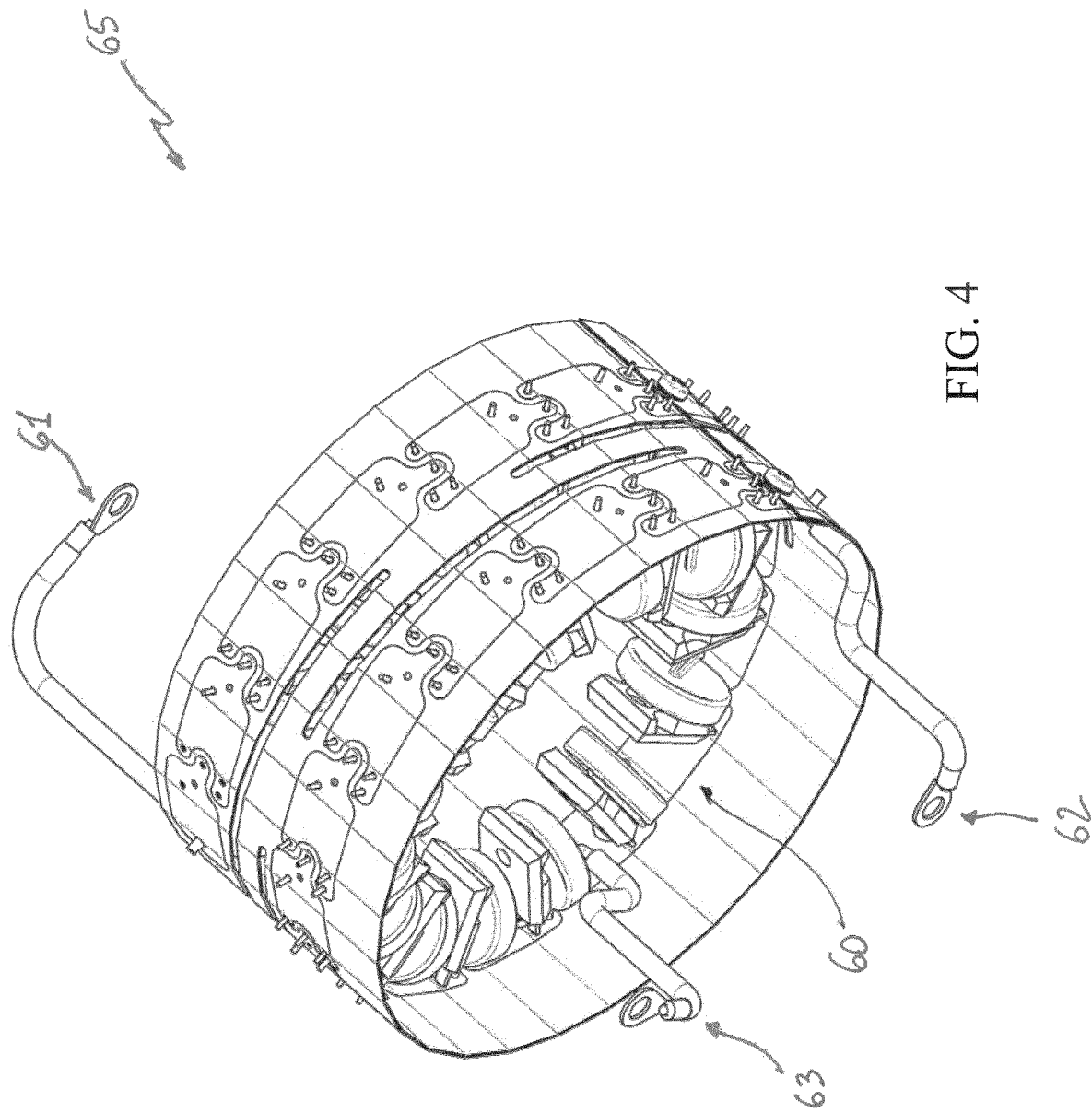

with at least an intermediate electric node positioned between two subsequent semiconductor devices. The input terminal is electrically connected with the fixed contact: the input terminal, the output terminal and the at least an intermediate terminal are electrically coupleable/decoupleable with/from the movable contact when the movable contact reaches different positions during a movement towards/away from the fixed contact in such a way that different groups of semiconductor devices switch in an ON state or in an OFF state at different instants during the movement of the movable contact, depending on the position reached by the movable contact.

20 Claims, 15 Drawing Sheets

(52) U.S. Cl.
CPC ............. *H05K 1/028* (2013.01); *H05K 1/181* (2013.01); *H05K 2201/051* (2013.01); *H05K 2201/10053* (2013.01); *H05K 2201/10174* (2013.01)

(56) References Cited

OTHER PUBLICATIONS

European Patent Office, Extended Search Report issued in corresponding Application No. 15175633.5, dated Dec. 14, 2015, 8 pp.

\* cited by examiner

SWITCHING DEVICE

The present invention relates to the field of switchgears for low or medium voltage electric power distribution networks.

More particularly, the present invention relates to an improved switching device for low or medium voltage electric power distribution networks.

In a further aspect, the present invention relates to a switchgear including the aforesaid switching device.

Within the framework of the present invention, the term "low voltage" (LV) relates to nominal operating voltages lower than 1 kV AC and 1.5 kV DC whereas the term "medium voltage" (MV) relates to nominal operating voltages higher than 1 kV AC and 1.5 kV DC up to some tens of kV, e.g. up to 72 kV AC and 100 kV DC.

As is known, switching devices are installed in electric power distribution networks for connecting/disconnecting a power line with/from one or more associated electrical loads. Traditional switching devices comprise one or more electric poles, each having a movable contact movable between a first operating position, in which it is coupled to a corresponding fixed contact, and a second operating position, in which it is decoupled from the fixed contact. Each electric pole is electrically connected to an electric power line and the associated electrical loads, in such a way that a current can flow between the power line and the electric loads through a main conducting path provided by the coupled fixed and movable contacts. On the other hand, the current flowing towards the electric loads is interrupted when the movable contacts are decoupled from the corresponding fixed contacts, for example in case of faults.

In some switching devices of the state of the art (such those disclosed in patent documents U.S. Pat. No. 8,064,173 and EP2523203), each electric pole is provided with a number of semiconductor devices (typically power diodes) configured to allow the passage of currents flowing according to a predetermined direction only.

Such semiconductor devices are electrically connected in series to each other and are arranged so as to allow/block the passage of currents flowing along an auxiliary current path, which is electrically connected in parallel with the aforesaid main current path.

As is known, in these switching devices, a suitable synchronization of the movements of the movable contacts with the waveforms of the electric line voltage and of the load current allows reducing remarkable parasitic phenomena during the operation of the switching device, such as the generation of electrical arcs during opening manoeuvres (when the electric power line is disconnected from an electric load, e.g. a bank of capacitors) and, on the other hand, limiting possible inrush currents and transient overvoltages generated during closing manoeuvres (when the electric line electrically couples with the electric load).

Unfortunately, current switching devices of the type described above have some critical aspects.

In consideration of the fact that the nominal operating voltages may reach some tens of kV, a large number of power diodes has to be employed, when said power diodes have small size and cannot withstand operating voltages above a given threshold value, typically about 1 kV for standard devices.

The experience has shown that presence of a huge number of power diodes makes difficult the synchronization of the movements of the movable contacts with the waveforms of the electrical quantities related to the electric poles, in particular during the opening manoeuvres of the switching device.

This can lead to the information of micro-arcs when the mobile contacts decouple from the corresponding fixed contacts.

As said micro-arcs may remarkably reduce the operating life of the electric contacts of the electric poles, it is often necessary to cover such electric contacts with protective materials with a consequent increase of time and costs for manufacturing the switching devices.

The main aim of the present invention is to provide a switching device for LV or MV electric power distribution networks that allows overcoming the drawbacks of the known art.

Within this aim, a purpose of the present invention is to provide a switching device, which shows improved performances in terms of reduction of parasitic phenomena during the opening/closing manoeuvres of the switching device.

A further purpose of the present invention is to provide a switching device, which shows improved commutation efficiency during the opening/closing manoeuvres.

A further purpose of the present invention is to provide a switching device, which is relatively simple and cheap to be manufactured at industrial levels.

The above aim and purposes, as well as other purposes that will emerge clearly from the following description and attached drawings, are provided according to the invention by a switching device for LV or MV electric power distribution networks, according to the following claim 1 and the related dependent claims.

In a further aspect, the present invention provides a switchgear for LV or MV installations, according to the following claim 15.

Figure 15:
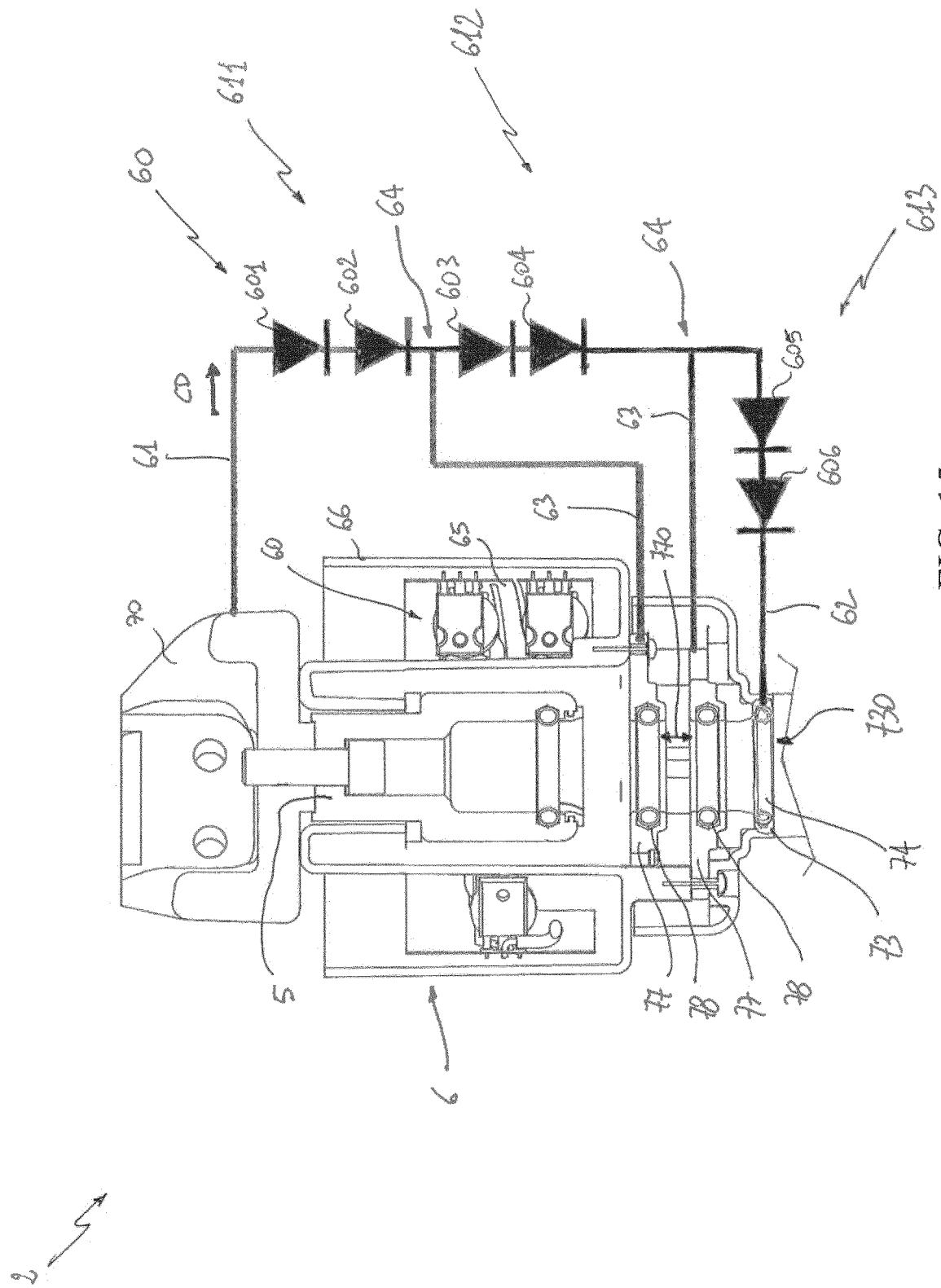

Further characteristics and advantages of the present invention will become more apparent from the detailed description of preferred embodiments illustrated only by way of non-limitative example in the accompanying drawings, in which:

FIG. 1 schematically shows the switching device, according to the invention;

FIGS. 2-14 schematically show the structure and operation of an electric pole in an embodiment of the switching device, according to the invention;

FIG. 15 is a partial view of the structure of an electric pole in a further embodiment of the switching device, according to the invention.

Referring to the cited figures, the present invention relates to a switching device 1.

The switching device 1 is particularly adapted for use in MV electric power distribution networks and it will be described hereinafter with reference to such specific application. However, the switching device 1 may be conveniently used also LV electric power distribution networks.

The switching device 1 is adapted to electrically connect/disconnect an electric power line 101 with/from one or more associated electric loads 102.

The switching device 1 is particularly useful for use in electric power distribution networks feeding capacitive loads and it will be described hereinafter with reference to such specific application. In principle, however, the electric loads 102 may be of any type, according to the needs.

The switching device 1 comprises one or more electric poles 2 (for example three as shown in FIG. 1), each of which is electrically connected to a corresponding electric phase of the electric power line 101 and of the associated electrical load 102.

Each electric pole 2 comprises a movable contact 4 and a fixed contact 5, which can couple/decouple one from another.

The fixed contact 5 is electrically connected with a first pole terminal 16 that is electrically connectable with a corresponding electric phase of the electric power line 101.

Advantageously, the electric pole 2 comprises a conductive base 70, on which the fixed contact 5 is mechanically mounted.

The conductive base 70 is, in turn, fixed to the first pole terminal 16 to ensure a suitable electric connection.

The movable contact 4 is electrically connected with a second pole terminal 17 of the electric pole 2, which is electrically connectable with a corresponding electric phase of the electric load 102.

Advantageously, the electric pole 2 comprises a conductive connection assembly 70A that is mechanically connected in a sliding manner with the movable contact 4 to ensure a suitable electric connection with this latter.

The conductive connection assembly 70A is, in turn, fixed to the second pole terminal 17 to ensure a suitable electric connection.

The moving contact 4 is adapted to (mechanically and electrically) couple with or decouple from the fixed contact 5 during a switching manoeuvre of the switching device 1.

During a closing manoeuvre of the switching device 1, the movable contact 4 moves towards the fixed contact 5 to couple with this latter in order to establish an electrical continuity between the pole terminals 16, 17 along a main conduction path 300.

During an opening manoeuvre of the switching device 1, the movable contact 4 moves away from the fixed contact 5 to decouple from this latter in order to interrupt the electrical continuity between the pole terminals 16, 17 along the main conduction path 300.

Preferably, the movable contact 4 moves linearly along a longitudinal axis X of the electric pole 2.

Preferably, each electric pole 2 comprises an insulating housing 95 that defines an internal volume, in which the internal components of the electric pole 2 (e.g. the movable contact 4 and the fixed contact 5) are accommodated.

Preferably, the switching device 1 comprises (e.g. for each electric pole 2) actuation means 91 and mechanical connection means 92 to actuate the movable contacts 4 during a switching manoeuvre of the switching device 1.

Preferably, the switching device 1 comprises control means 96 (e.g. including one or more microprocessors) for controlling the operations of the actuation means 91 and/or other functionalities of the switching device 1.

Each electric pole 2 comprises a circuit assembly 6, which comprises a plurality of solid-state semiconductor devices 601, 602, 603, 604, 605, 606 (which are also collectively indicated by the reference 60 in the cited figures) adapted to switch in an ON state (conduction state) or in an OFF state (interdiction state) depending on the voltage applied thereon.

The semiconductor devices 60 are advantageously configured to operate as electric diodes. Thus, when they switch in an ON state, the semiconductor devices 60 allow the flow of a current according to a predefined conduction direction, whereas, when they switch in an OFF state, the semiconductor devices 60 block the flow of a current passing there through.

The semiconductor devices 60 may be, as a non-limiting example, power didoes (as shown in the cited figures) or thyristors or power transistors.

The semiconductor devices 60 are electrically connected in series one to another to form a chain of semiconductor devices.

The chain 60 of semiconductor devices is configured to allow a current to flow according to a predefined conduction direction CD, when the semiconductor devices thereof are in an ON state.

The circuit assembly 6 comprises an input terminal 61 and an output terminal 62.

The input terminal 61 is electrically connected to a first semiconductor device 601 of the chain 60 of semiconductor devices (taking as a reference the conduction direction CD) whereas the output terminal 62 is electrically connected to a last semiconductor device 604 (or 606 in the embodiment of FIG. 15) of the chain 60 of semiconductor devices.

In the embodiments of the invention shown in the cited figures (in which power diodes are used), the chain 60 of power diodes is configured so that such power diodes (electrically connected in series) have their anodes and cathodes oriented towards the input terminal 61 and the output terminal 62, respectively.

The circuit assembly 6 comprises one or more intermediate terminals 63, each of which is electrically connected with a corresponding intermediate electric node 64 positioned between two subsequent semiconductor devices 602, 603 (and also 604, 605 in the embodiment of FIG. 15) of the chain 60 of semiconductor devices.

In the embodiment shown in FIGS. 2-14, the circuit assembly 6 comprises a single intermediate terminal 63 electrically connected with a corresponding intermediate electric node 64 positioned between two subsequent semiconductor devices 602, 603.

More in general, the circuit assembly 6 may comprise a plurality of intermediate terminals 63, each of which is electrically connected with a corresponding intermediate electric node 64 positioned between two subsequent semiconductor devices of the chain 60 of semiconductor devices.

For example, in the embodiment shown in FIG. 15, the circuit assembly 6 comprises two intermediate terminals 63, each of which is electrically connected with a corresponding intermediate electric node 64 positioned between two pairs of subsequent semiconductor devices 602, 603 and 604, 605.

The chain 60 of semiconductor devices comprises a plurality of groups of semiconductor devices, each group being substantially defined by the number and position of the one or more electric nodes 64 electrically connected with the corresponding one or more intermediate terminals 63.

Obviously, said groups of semiconductor devices are electrically connected in series between the input and output terminals 61, 62.

In the embodiment shown in FIGS. 2-14, the chain of semiconductor devices 60 comprises a first group 611 of semiconductor devices electrically connected in series between the input terminal 61 and the intermediate terminal 63, and a second group 612 of semiconductor devices electrically connected in series between the intermediate terminal 63 and the output terminal 62.

In the embodiment shown in FIG. 15, the chain of semiconductor devices 60 comprises a first group 611 of semiconductor devices electrically connected in series between the input terminal 61 and an intermediate terminal 63, a second group 612 of semiconductor devices electrically connected in series between said intermediate terminal 63 and a further intermediate terminal 63 and a third group 613 of semiconductor devices electrically connected in series between a further intermediate terminal 63 and the output terminal 62. In general, when the circuit assembly 6 comprises N intermediate terminals (N>=1), the chain of semiconductor devices 60 comprises N+1 groups of semiconductor devices electrically connected in series between the terminals of the circuit assembly 6.

The input terminal 61 of the circuit assembly 6 is electrically connected to the fixed contact 5. The input terminal 61, the output terminal 62 and each intermediate terminal 63 of the circuit assembly 6 are electrically coupleable/decoupleable with/from the movable contact 4.

More particularly, the input terminal 61, the output terminal 62 and each intermediate terminal 63 of the circuit assembly 6 are adapted to electrically couple/decouple with/from the movable contact 4 when this latter reaches different positions during the movement towards/away from the fixed contact 5, i.e. during a closing or opening manoeuvre of the switching device 1.

Referring to the embodiment of the invention shown in FIGS. 2-14, the input terminal 61, the output terminal 62 and the intermediate terminal 63 electrically couple/decouple with/from the movable contact 4 when this latter reaches different given positions $P_1$, $P_2$, $P_3$, $P_4$ during the movement towards/away from the fixed contact 5, i.e. during a closing or opening manoeuvre of the switching device 1.

Figure 8:
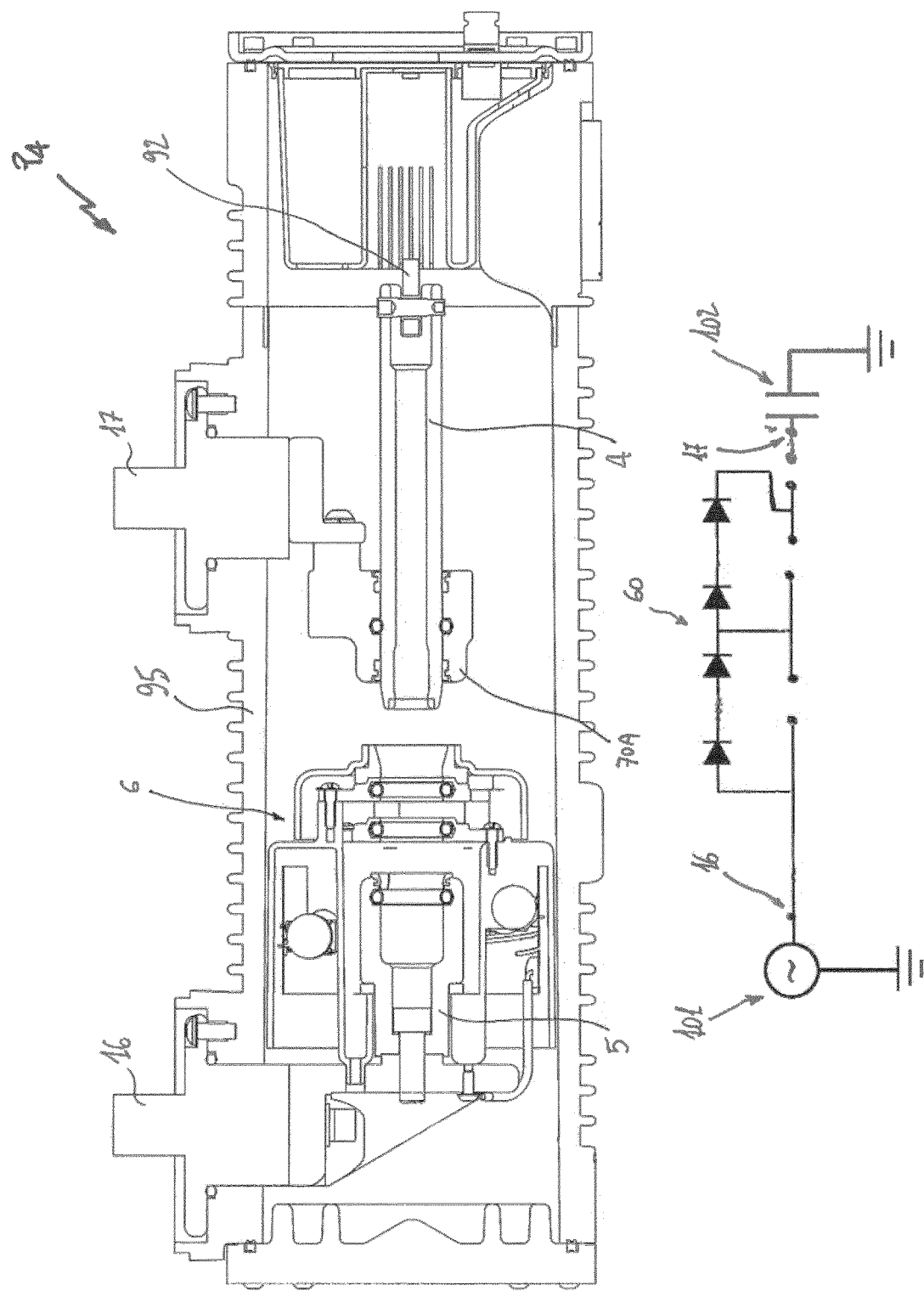

More particularly, during the movement towards/away from the fixed contact 5, the movable contact 4 can reach:
- a first position $P_1$, in which it is electrically coupled with the fixed contact 5 and with the input, output and intermediate terminals 61, 62, 63 (FIG. 5);
- a second position $P_2$, in which it is electrically decoupled from the fixed contact 5 and from the input terminal 61 and is electrically coupled with the output and intermediate terminals 62, 63 (FIG. 6);
- a third position $P_3$, in which it is electrically decoupled from the fixed contact 5 and from the input and intermediate terminals 61, 63 and is electrically coupled with the output terminal 62 (FIG. 7);
- a fourth position $P_4$, in which it is electrically decoupled from the fixed contact 5 and from the input, output and intermediate terminals 61, 62, 63 (FIG. 8).

In general terms, as the input terminal 61, the output terminal 62 and each intermediate terminal 63 are electrically coupleable/decoupleable with/from the movable contact 4 at different given positions of this latter, different groups of semiconductor devices of the chain of semiconductor devices 60 switch in an ON state or in an OFF state at different instants during the movement of the movable contact 4, depending on the position reached by the movable contact itself with respect to the terminals 61, 62, 63.

In fact, the chain of semiconductor devices 60 is configured to form auxiliary conduction paths 400, 500 between the pole terminals 16, 17 given the fact that the input terminal 61 is electrically connected with the fixed contact 5 (and therefore with the first pole terminal 16) and that the terminals 61, 62, 63 are electrically coupleable/decoupleable with/from the movable contact 4 (and therefore with the second pole terminal 17).

Depending on the position of the movable contact 4 with respect to the terminals 61, 62, 63, the auxiliary conduction paths 400, 500 may be interrupted or short-circuited or comprise one or more of the groups 611, 612 (and also 613 in the embodiment of FIG. 15) of semiconductor devices.

Referring again to the embodiment of the invention shown in FIGS. 2-14, as the input terminal 61, the output terminal 62 and the intermediate terminal 63 electrically couple/decouple with/from the movable contact 4 at different given positions $P_1$, $P_2$, $P_3$, $P_4$, the first and second groups 611, 612 of semiconductor devices switch in an ON state or in an OFF state at different instants during the movement of the movable contact 4, depending on the position of the movable contact itself with respect to the terminals 61, 62, 63.

When the movable contact 4 is in or reaches the first position $P_1$ (FIG. 5), the first and second groups 611, 612 of semiconductor devices are or switch in an OFF state, as all the terminals 61, 62, 63 are short-circuited.

In this case, the auxiliary conduction paths 400 and 500 are short-circuited in whole and no currents pass through it (apart from possible negligible parasitic leakages).

The main conduction path 300 instead ensures an electrical continuity between the pole terminals 16, 17 as the fixed contact 5 and the movable contact 4 are electrically coupled. A load current $I_{LOAD}$ passes through the main conduction path 300.

When the movable contact 4 reaches the second position $P_2$ (FIG. 6), the first group 611 of semiconductor devices switch in an ON state, when a positive voltage higher than a given first threshold voltage value is applied between the input and output terminals 61, 62 (the output terminal 62 is short-circuited with the intermediate terminal 63).

Such a first voltage threshold value (e.g. of few volts) depends on the physical characteristics of the semiconductor devices 601, 602 and is typically very smaller than the peak value of the voltage of the electric power line 101.

The second group 612 of semiconductor devices is instead in an OFF state as the output and intermediate terminals 62, 63 are short-circuited and no currents pass through the semiconductor devices 603, 604 (apart from possible negligible parasitic leakages).

A load current $I_{LOAD}$ passes through the first auxiliary conduction path 400, which, in this case, comprises the input terminal 61, the first group 611 of semiconductor devices and the intermediate terminal 63.

The first auxiliary conduction path 400 ensures an electrical continuity between the pole terminals 16, 17 whereas the main conduction path 300 is interrupted as the fixed contact 5 and the movable contact 4 are electrically decoupled.

When the movable contact 4 reaches the third position $P_3$ (FIG. 7), the first and second groups 611, 612 of semiconductor devices switch in an ON state, when a positive voltage higher than a given second threshold voltage value is applied between the input and output terminals 61, 62.

The second threshold voltage value (few volts—however higher than the first threshold voltage value) depends on the characteristics of the semiconductor devices 601, 602, 603, 604 and is very smaller than the peak value of the voltage of the electric power line 101.

A load current $I_{LOAD}$ passes through the second auxiliary conduction path 500, which, in this case, comprises the input terminal 61, the first and second groups 611, 612 of semiconductor devices and the output terminal 62.

The second auxiliary conduction path 500 ensures an electrical continuity between the pole terminals 16, 17 whereas the main conduction path 300 is interrupted as the fixed contact 5 and the movable contact 4 are electrically decoupled.

When the movable contact 4 is in or reaches the fourth position $P_4$ (FIG. 8), the first and second groups 611, 612 of semiconductor devices switch in an OFF state.

The intermediate and output terminals 63, 62 are electrically decoupled from the movable contact 4 and no currents pass through the auxiliary conduction path 400 and/or 500.

Also the main conduction path 300 is interrupted as the fixed contact 5 and the movable contact 4 are electrically decoupled.

With reference to the embodiment of the invention shown in FIGS. 2-14, FIGS. 9-10 schematically show an exemplary behaviour of some relevant electrical quantities such as the line voltage $V_{LINE}$ of the electric power line 101, the load voltage $V_{LOAD}$ applied to the electric load 102 (which is supposed to be of capacitive type) and the load current $I_{LOAD}$ passing through the electric pole 2 during a closing manoeuvre of the switching device 1.

When analysing the behaviour of the aforesaid relevant electrical quantities, the above mentioned first and second threshold voltage values can be approximated at 0V, as they are negligible with respect to the peak value of the line voltage $V_{LINE}$.

At the instant $t_0$, the movable contact 4 is supposed to start moving towards the fixed contact 5.

In this situation, the movable contact 4 is still electrically decoupled from the input, output and intermediate terminals 61, 62, 63 and from the fixed contact 5 (fourth position $P_4$).

No load current $I_{LOAD}$ flows towards the electric load 102 as the main conduction path 300 and the auxiliary conduction paths 400 and 500 are still interrupted.

At the instant $t_1$, the movable contact 4 is supposed to reach the third position $P_3$, thereby being electrically coupled with the output terminal 62 and being electrically decoupled from the input and intermediate terminals 61, 63 and from the fixed contact 5.

Supposing that the load voltage VLOAD is initially at 0V, the line voltage $V_{LINE}$ is applied between the input and output terminals 61, 62 of the circuit assembly 6.

Figure 9:
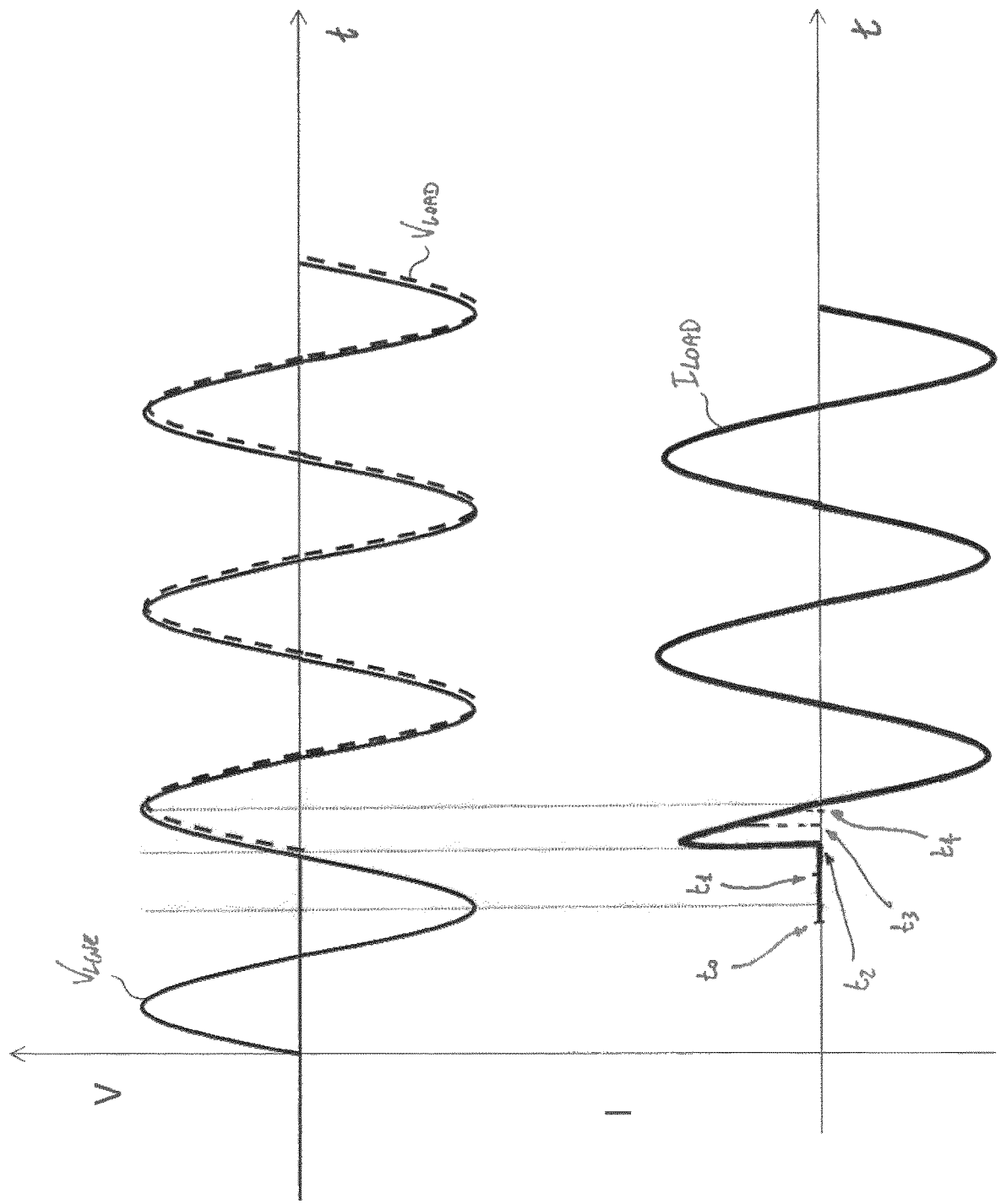
Figure 10:
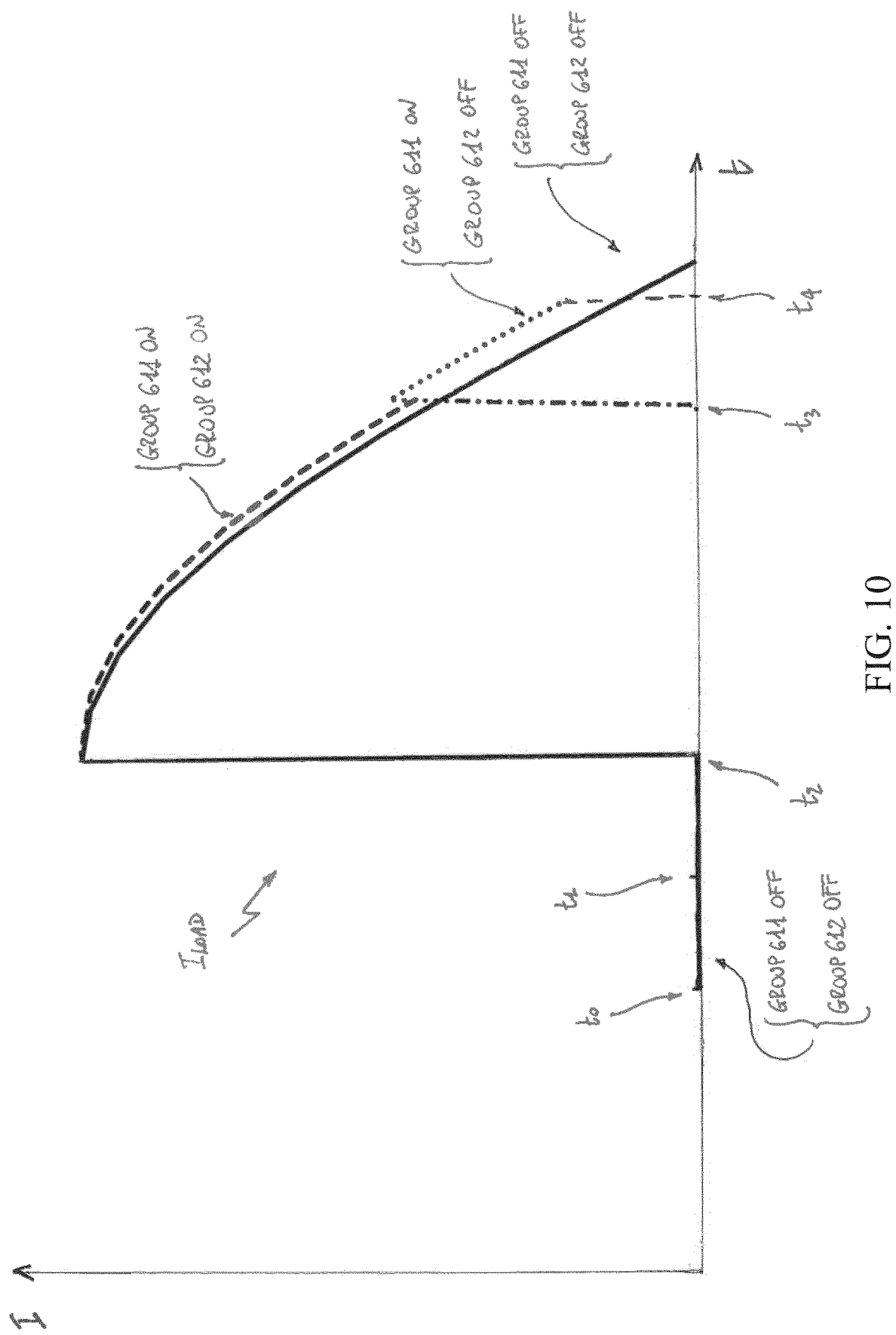
Figure 11:
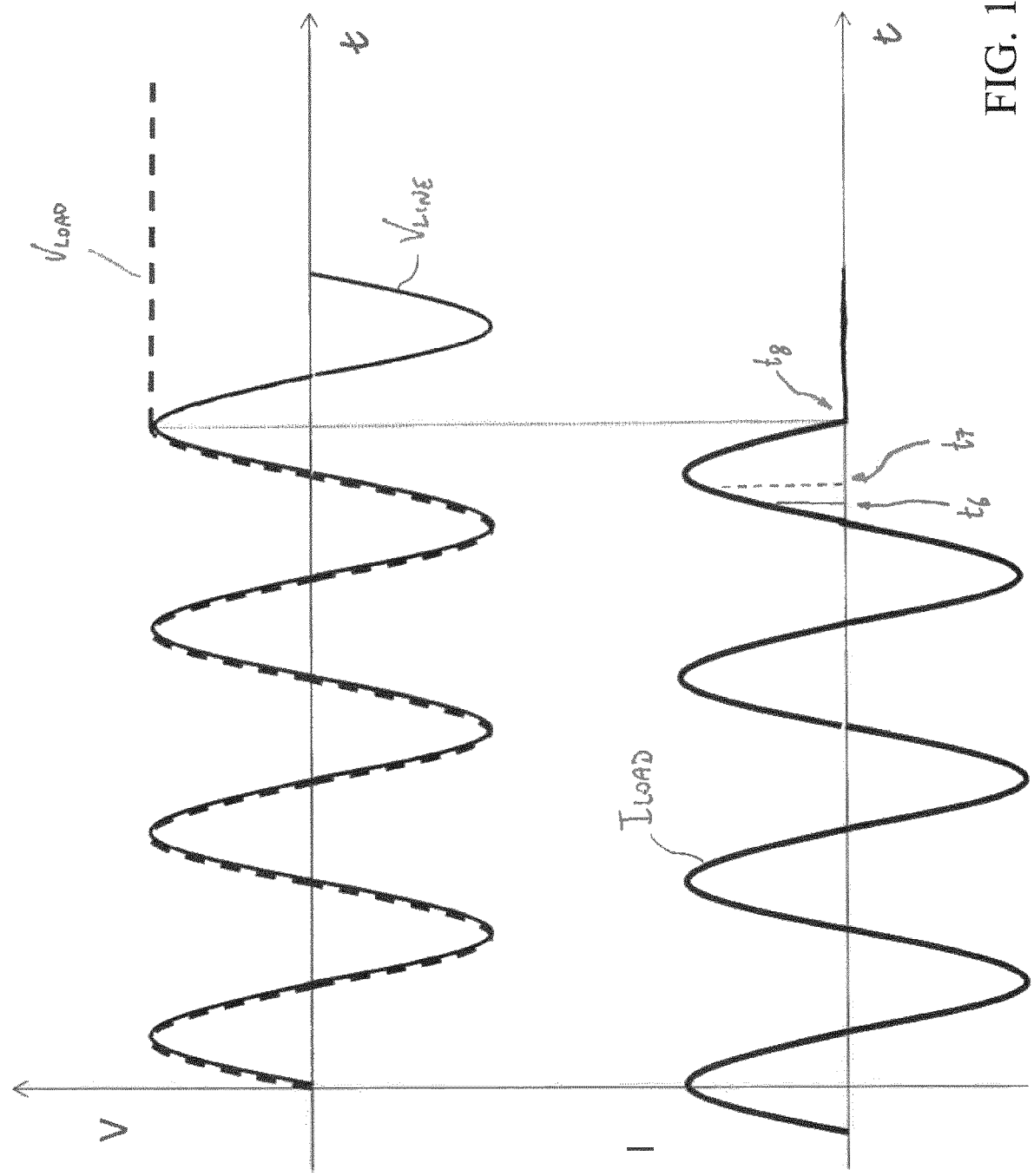
Figure 12:
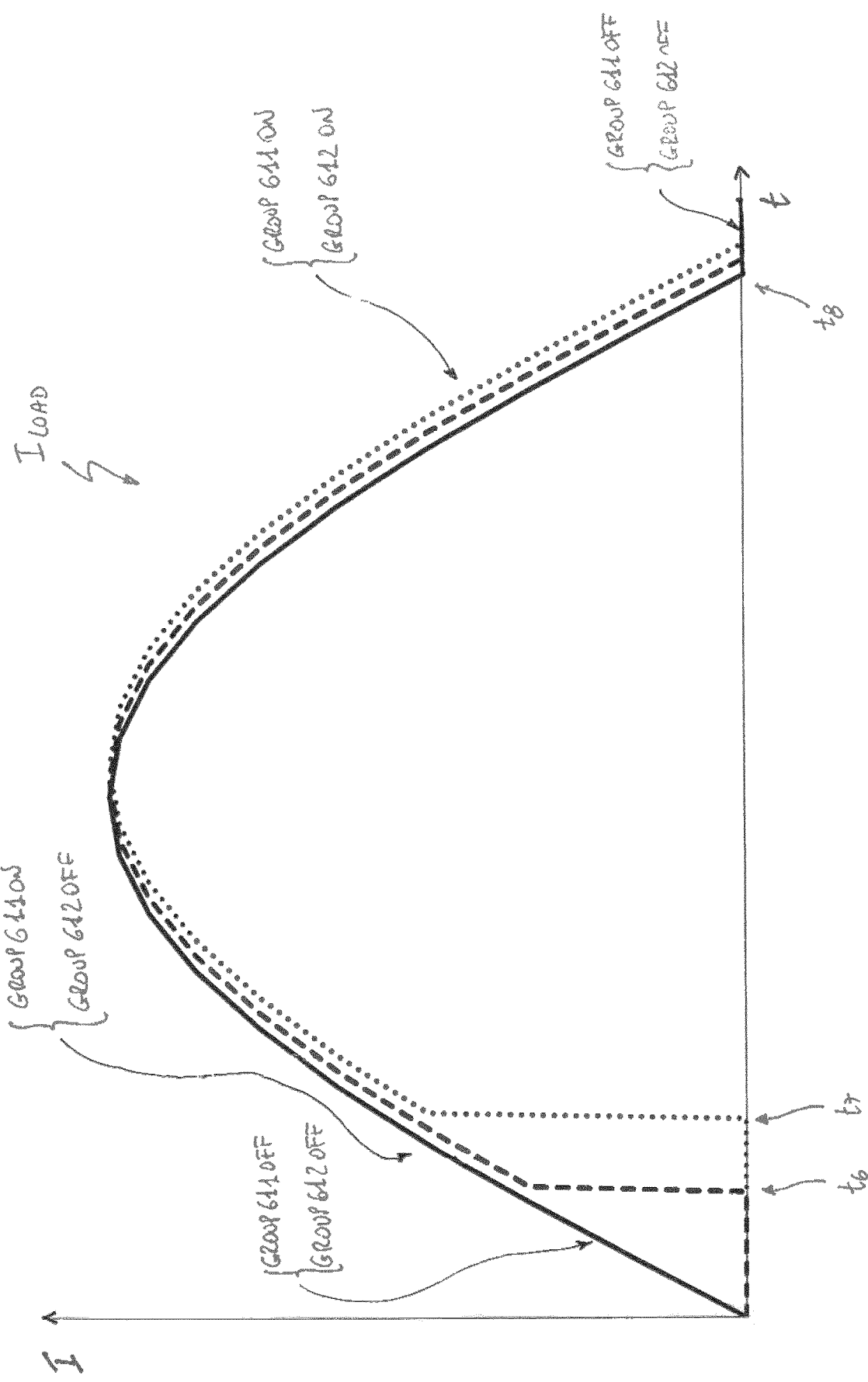
Figure 13:
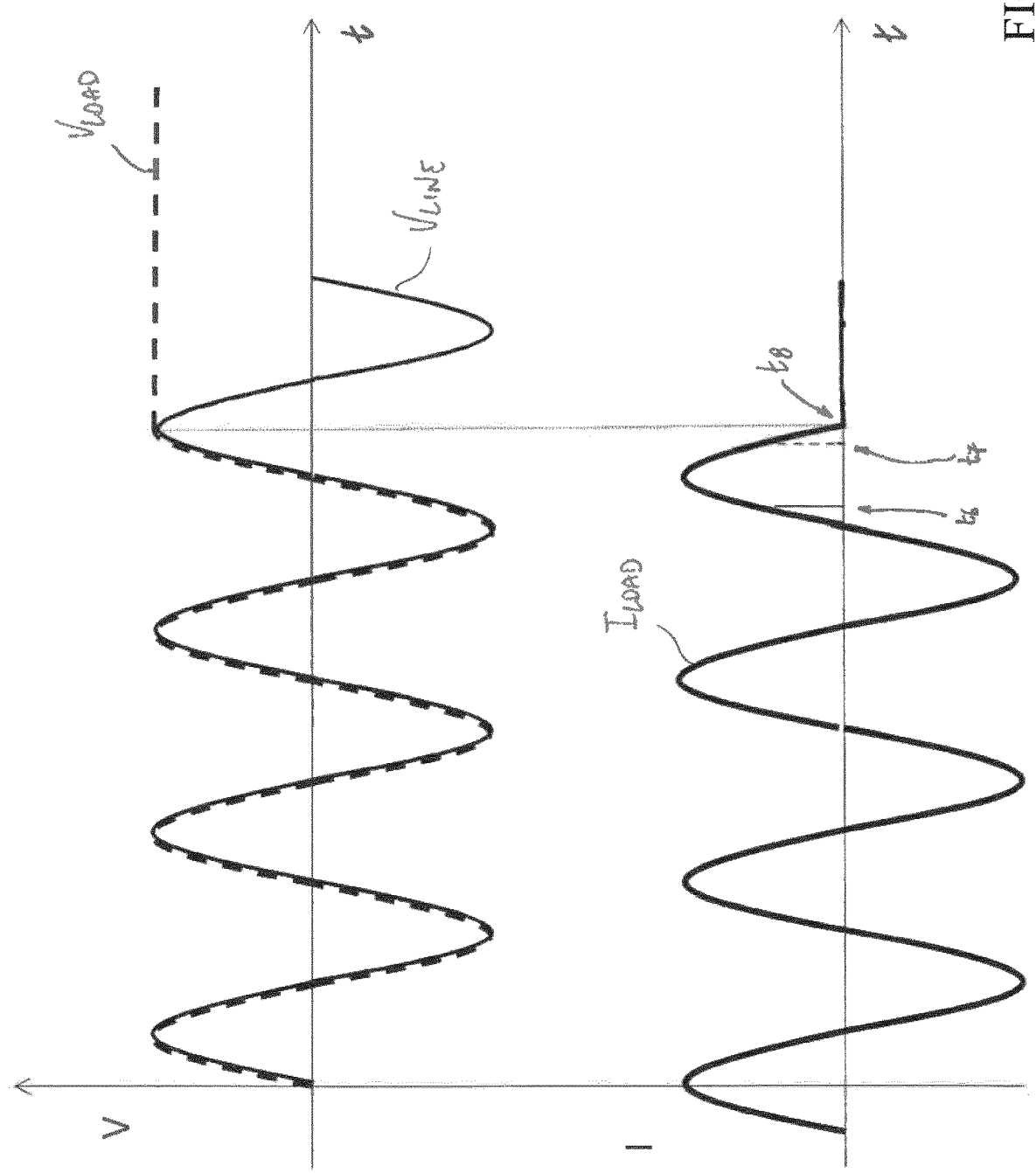
Figure 14:
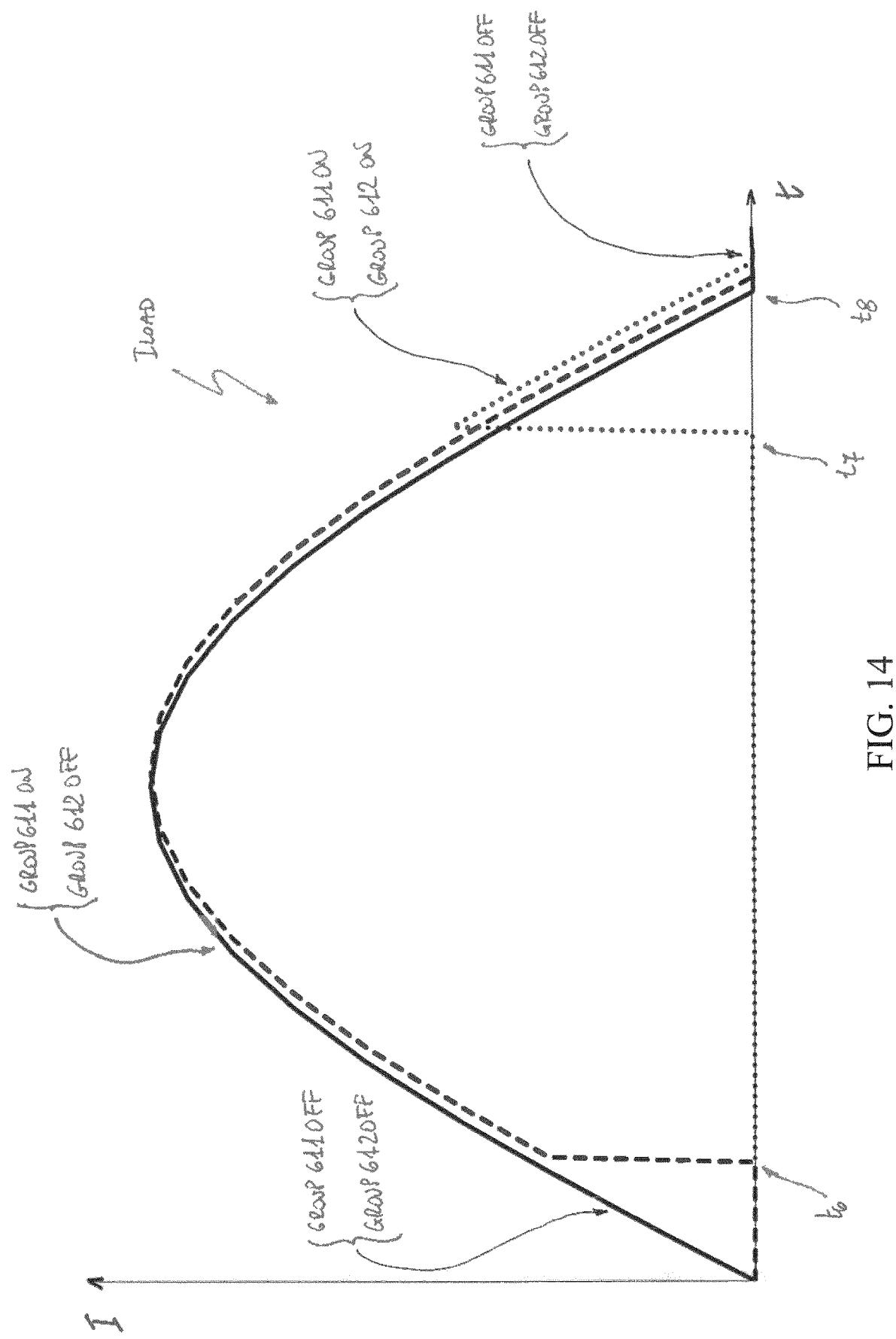

In the example shown in FIGS. 9-10, the first and second groups 611, 612 of semiconductor devices remain in an OFF state at the instant $t_1$, as the line voltage $V_{LINE}$ is still negative. The first and second groups 611, 612 of semiconductor devices switch in an ON state at the instant $t_2$, as soon as the line voltage $V_{LINE}$ becomes positive (zero crossing).

At the instant $t_2$, the load current $I_{LOAD}$ starts passing through the second auxiliary conduction path 500, which, in this case, comprises the input terminal 61, the first and second groups 611, 612 of semiconductor devices and the output terminal 62.

The second auxiliary conduction path 500 ensures an electrical continuity between the pole terminals 16, 17 and the load voltage $V_{LOAD}$ starts following the line voltage $V_{LINE}$ (apart from a small resistive voltage drop offered by the semiconductor devices 601, 602, 603, 604 in an ON state).

At the instant $t_3$, the movable contact 4 is supposed to reach the second position $P_2$, thereby being electrically coupled with the intermediate and output terminals 63, 62 and being electrically decoupled from the input terminal 61 and from the fixed contact 5.

The first group 611 of semiconductor devices remains in an ON state, as a positive voltage (basically due to the resistive voltage drop offered by the semiconductor devices 601, 602 in ON state) is applied between the input and intermediate terminals 61, 63 (the output and intermediate terminals 62, 63 are short-circuited).

The second group 612 of semiconductor devices instead switches in an OFF state, as the intermediate and output terminals 63, 62 are short-circuited.

At the instant $t_3$, the load current $I_{LOAD}$ continues to pass through the auxiliary conduction path 400, which, in this case, comprises the input terminal 61, the sole first group 611 of semiconductor devices and the output terminal 62.

The auxiliary conduction path 400 ensures an electrical continuity between the pole terminals 16, 17 and the load voltage $V_{LOAD}$ follows the line voltage $V_{LINE}$ (apart from a small resistive voltage drop offered by the semiconductor devices 601, 602 in an ON state).

At the instant $t_4$, the movable contact 4 is supposed to reach the first position $P_1$, thereby being electrically coupled with the input, intermediate and output terminals 61, 63, 62 and with the fixed contact 5.

The first group 611 of semiconductor devices switches in an OFF state, as the input and intermediate terminals 61, 63 are short-circuited.

The second group 612 of semiconductor devices remains in an OFF state, as the intermediate and output terminals 63, 62 are short-circuited.

The auxiliary conduction paths 400 and 500 are short-circuited and the load current $I_{LOAD}$ passes through the main conduction path 300 as the movable and fixed contacts 4, 5 are electrically coupled.

The main conduction path 300 ensures an electrical continuity between the pole terminals 16, 17 and the load voltage $V_{LOAD}$ follows the line voltage $V_{LINE}$.

In relation to the above illustrated example, it is evident that the behaviour of the above electrical quantities (in particular of the load current $I_{LOAD}$) can vary depending of the timing of the instants $t_1$, $t_2$, $t_3$, $t_4$, which in turn depends on the initial instant of the closing manoeuvre, the motion law followed by the movable contact 4 and the relative positions among the terminals 61, 62, 63 and the fixed contact 5.

However, the above illustrated example shows how the groups 611, 612 of semiconductor devices switch in an ON state or in an OFF state at different instants $t_2$, $t_3$, $t_4$ during the movement of the movable contact 4 depending on the position reached by this latter during the closing manoeuvre of the switching device 1.

Referring to the embodiment of the invention shown in FIGS. 2-14, FIGS. 11-14 schematically show an exemplary behaviour of the electrical quantities $V_{LINE}$, $V_{LOAD}$ and $I_{LOAD}$ during an opening manoeuvre of the switching device 1.

Again, the above mentioned first and second threshold voltage values are approximated at 0V, as they are negligible with respect to the peak value of the line voltage $V_{LINE}$.

Before the movable contact 4 starts moving away from the fixed contact 5, the movable contact is electrically coupled with the input, output and intermediate terminals 61, 62, 63 and with the fixed contact 5 (first position $P_1$).

In this situation, both the first and second groups 611, 612 of semiconductor devices are in an OFF state and the auxiliary conduction paths 400 and 500 are short-circuited.

The load current $I_{LOAD}$ passes through the main conduction path 300 as the movable and fixed contacts 4, 5 are electrically coupled.

The main conduction path 300 ensures an electrical continuity between the pole terminals 16, 17 and the load voltage $V_{LOAD}$ follows the behaviour of the line voltage $V_{LINE}$.

At the instant $t_6$, the movable contact 4 is supposed to reach the second position $P_2$, thereby being electrically coupled with the intermediate and output terminals 63, 62 and being electrically decoupled from the input terminal 61 and from the fixed contact 5.

The separation between the movable contact 4 and the fixed contact 5 forces the load current $I_{LOAD}$ to pass through the chain 60 of semiconductor devices.

The first group 611 of semiconductor devices switch in an ON state, as a positive voltage (basically due to the resistive voltage drop offered by the semiconductor devices 601, 602) is applied between the input and output terminals 61, 62 that are no more short-circuited (the output terminal 62 is still short-circuited with the intermediate terminal 63).

The second group 612 of semiconductor devices instead remains in an OFF state, as the intermediate and output terminals 63, 62 are still short-circuited.

The load current $I_{LOAD}$ starts passing through the auxiliary conduction path 400, which, in this case, comprises the input terminal 61, the sole first group 611 of semiconductor devices and the output terminal 63.

The auxiliary conduction path 400 ensures an electrical continuity between the pole terminals 16, 17 and the load voltage $V_{LOAD}$ follows the line voltage $V_{LINE}$ (apart from a small resistive voltage drop due to the semiconductor devices 601, 602 in an ON state).

At the instant $t_7$, the movable contact 4 is supposed to reach the third position $P_3$, thereby being electrically coupled with the output terminal 62 and being electrically decoupled from the intermediate terminals 63 and from the fixed contact 5.

The first group 611 of semiconductor devices remains in an ON state, as a positive voltage (basically due to the resistive drop offered by the semiconductor devices 601, 602 in an ON state) is applied between the input and intermediate terminals 61, 63 that are no more short-circuited.

The second group 612 of semiconductor devices switches in an ON state, as a positive voltage (basically due to the resistive drop offered by the semiconductor devices 603, 604) is applied between the intermediate and output terminals 63, 62 that are no more short-circuited.

The load current $I_{LOAD}$ continues to pass through the second auxiliary conduction path 500, which, in this case, comprises the input terminal 61, the first and second groups 611, 612 of semiconductor devices and the output terminal 62.

The auxiliary conduction path 500 ensures an electrical continuity between the pole terminals 16, 17 and the load voltage $V_{LOAD}$ follows the line voltage $V_{LINE}$ (apart from a small resistive voltage drop due to the semiconductor devices 601, 602, 603, 604 in an ON state).

After the instant $t_8$, the movable contact 4 is supposed to reach the fourth position $P_4$, thereby being electrically decoupled from the input, output and intermediate terminals 61, 62, 63 and from the fixed contact 5.

No load current $I_{LOAD}$ flows towards the electric load 102 as the main conduction path 300 and the auxiliary conduction paths 400 and 500 are interrupted.

The load voltage $V_{LOAD}$ does not follow the line voltage $V_{LINE}$ anymore (it remains initially constant at the peak value of the voltage $V_{LINE}$).

In relation to the above illustrated example, it is evident that the behaviour of the above electrical quantities (in particular of the load current $I_{LOAD}$) can vary depending of the timing of the instants $t_6$, $t_7$, $t_8$, which in turn depends on the initial instant of the opening manoeuvre, the motion law followed by the movable contact 4 and the relative positions among the terminals 61, 62, 63 and the fixed contact 5. As an example, FIGS. 11-12 and FIGS. 13-14 show different possible timing selections for the mentioned instants $t_6$, $t_7$ during the opening manoeuvre.

However, the above illustrated example shows how the groups 611, 612 of semiconductor devices switch in an ON state or in an OFF state at different instants $t_6$, $t_7$, $t_8$ during the movement of the movable contact 4 depending on the position reached by this latter during the opening manoeuvre of the switching device 1.

Preferably, the electric pole 2 comprises first electric connection means to electrically connect the input terminal 61 of the circuit assembly 6 with the fixed contact 5.

Figure 5:
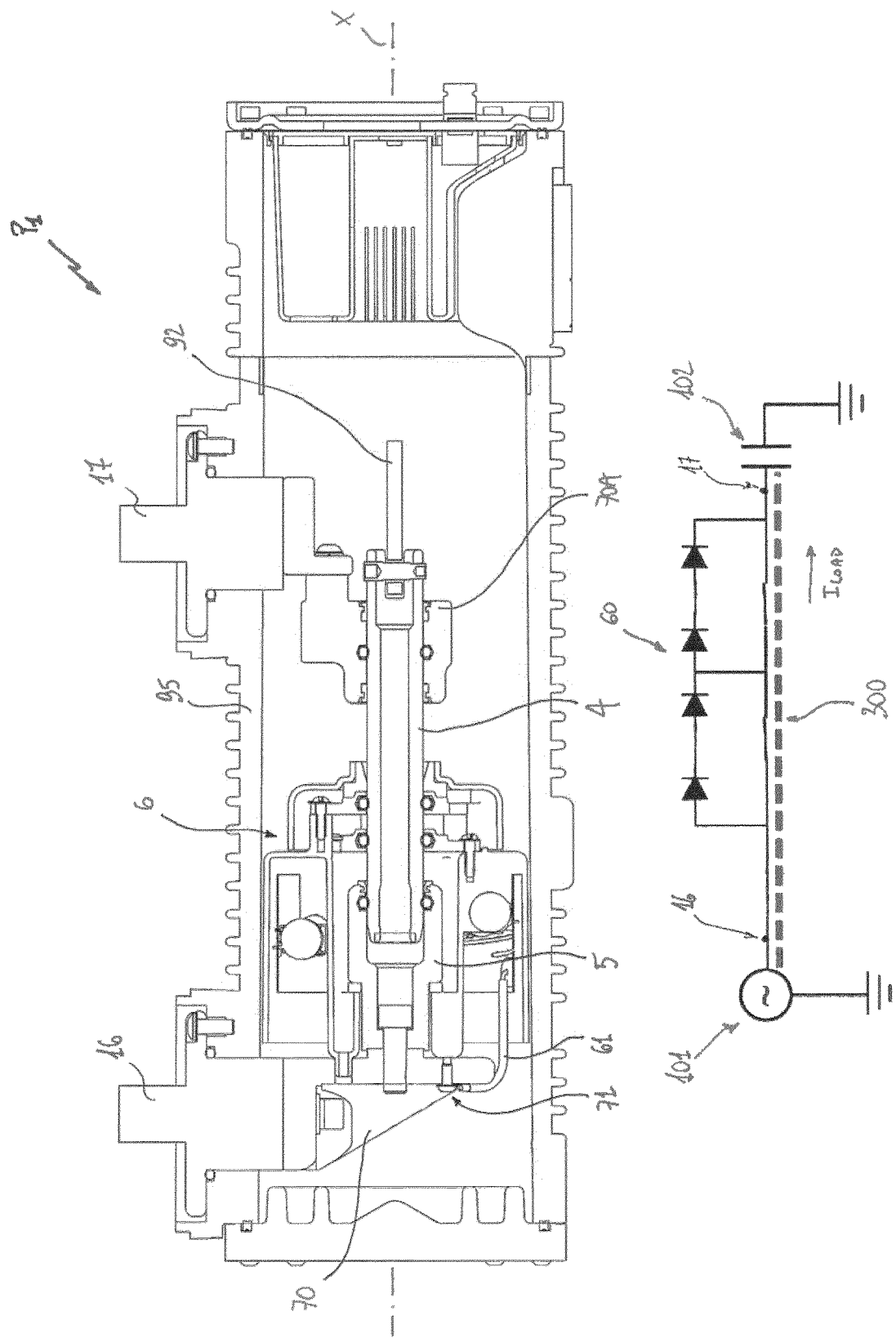
Figure 6:
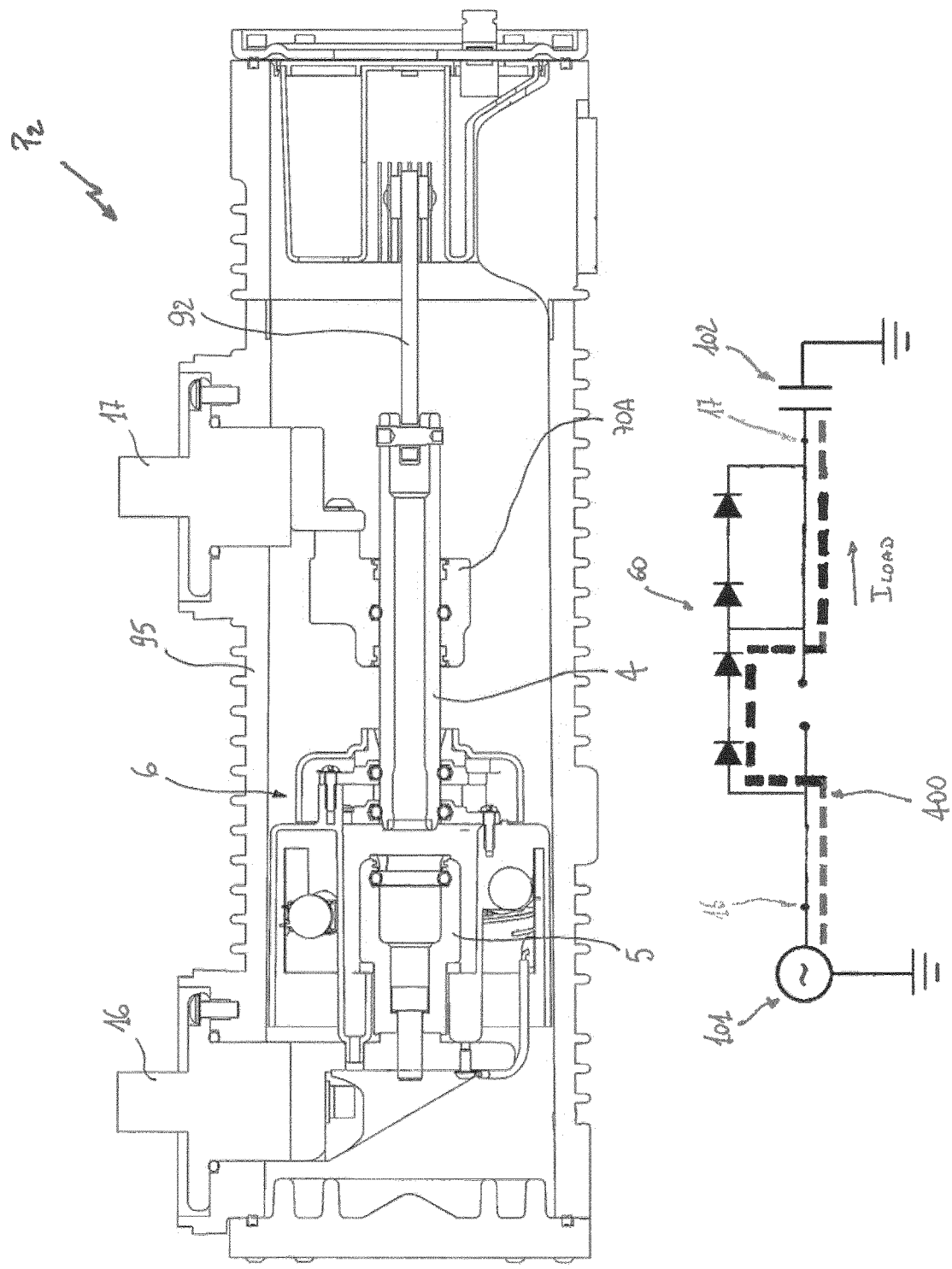
Figure 7:
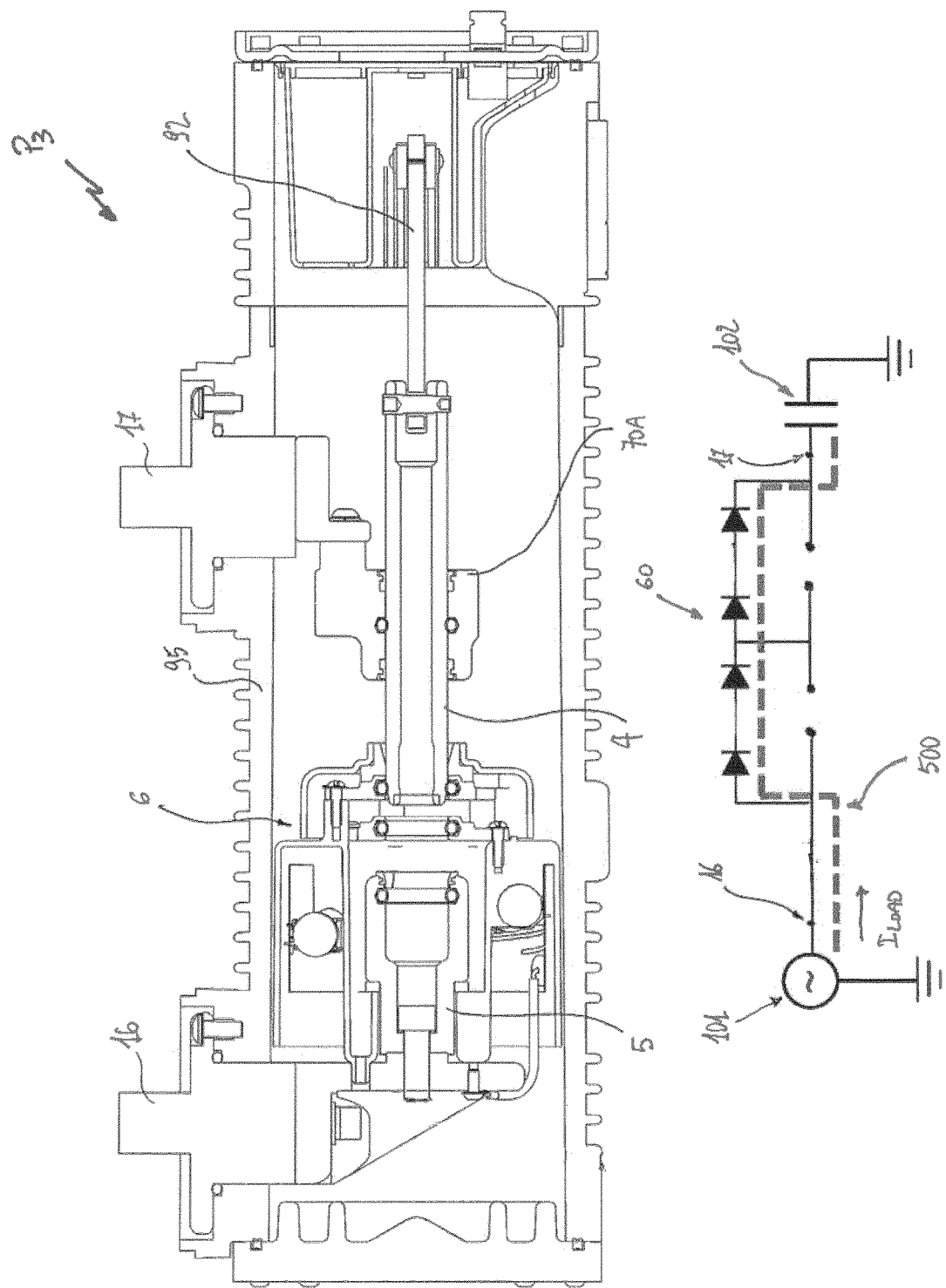

Preferably, the first electric connection means comprise the conductive base 70, on which the fixed contact 5 is mounted and first fixing means 71 for connecting the input terminal 61 with the conductive base 70 (FIG. 5). The first fixing means 71 may be of known type, e.g. a connection screw.

Preferably, the electric pole 2 comprises second electric connection means to electrically connect the output terminal 62 of the circuit assembly 6 with the movable contact 4.

Preferably, the second electric connection means comprise a first conductive plate 73, which has a first through hole 730. Advantageously, the first conductive plate 73 is arranged so that the movable contact can pass through the first through hole 730 during the movements towards/away from the fixed contact 5.

Preferably, the second electric connection means comprise a first sliding contact ring 74 coupled with the first conductive plate 73 at the first through hole 730. Advantageously, the first contact ring 74 is arranged at the edge of the first through hole 730 so as to slidingly contact the movable contact 4, when this latter passes through the first through hole 730.

Preferably, the second electric connection means comprise second fixing means (not shown) for connecting the output terminal 62 with said first conductive plate 73. The second fixing means may be of known type, e.g. a connection screw.

Preferably, the electric pole 2 comprises third electric connection means to electrically connect each intermediate terminal 63 of the circuit assembly 6 with the movable contact 4. Preferably, the third electric connection means comprise one or more second conductive plates 77, each having at last a second through hole 770. Advantageously, each second conductive plate 77 is arranged so that the movable contact can pass through the second through hole 770 during the movements towards/away from the fixed contact 5.

Preferably, the third electric connection means comprise one or more second sliding contact rings 78, each of which is coupled with a corresponding second conductive plate 77 at the second through hole 770. Advantageously, each second contact ring 78 is arranged at the edge of the corresponding second through hole 770 so as to slidingly contact the movable contact 4, when this latter passes through the second through hole 770.

Preferably, the second electric connection means comprise third fixing means (not shown) for connecting each intermediate terminal 63 with the corresponding second conductive plate 77. The third fixing means may be of known type, e.g. a connection screw.

Preferably, the circuit assembly 6 comprises a printed circuit board 65 on which the semiconductor devices 601, 602, 603, 604, 605, 606 are mounted and electrically connected one to another through suitable conductive stripes.

Preferably, the input terminal 61, the output terminal 62 and each intermediate terminal 63 are fixed to the printed board 65 with fixing means of known type (e.g. connection screws, soldering, and the like).

The input terminal 61, the output terminal 62 and each intermediate terminal 63 may be formed by corresponding electric cables.

Preferably, the circuit assembly 6 comprises an insulating case 66, which is fixed to the conductive base 70 or to the insulating housing 95 of the electric pole 2.

The insulating case 66 advantageously defines a volume in which the printed circuit board 65 is positioned.

According to a possible embodiment of the invention, which is shown in the cited figures, the printed circuit board 65 has a flexible structure that can be folded in a rolled position.

In this case, the insulating case 66 is advantageously configured to accommodate the flexible printed circuit board 65 in a rolled position.

Preferably, as shown in the cited figures, the insulating case 66 has a toroidal structure provided with a central hole 660 (FIG. 2) arranged so as to accommodate the fixed contact 5 and allow the passage of the movable contact 4 therethrough.

In this case, the circuit assembly 6 is advantageously configured in such a way to surround at least partially the fixed contact 5 and the movable contact 4, when this latter is coupled to the fixed contact 5.

The switching device 1, according to the invention, offers remarkable advantages.

The activation/deactivation of different groups of semiconductor devices at different instants allows relaxing the time synchronization requirements to ensure that auxiliary conduction paths 400 and/or 500 are established before/after the coupling/decoupling between the movable and fixed contacts 4, 5 during the switching manoeuvres of the switching device.

This allows obtaining improved commutation efficiency with respect to the available switching devices of the state of the art.

Further, the differentiated activation of different groups 611, 612 of semiconductor devices allows reducing micro-arc phenomena during an opening manoeuvre of the switching device 1 and allows improving reduction capabilities of inrush currents and transient over-voltages during a closing manoeuvre of the switching device 1.

The switching device 1 can thus show an improved reduction of parasitic phenomena with respect to the available traditional switching devices.

This allows simplifying the structure of the electric poles 2 and reducing the overall manufacturing costs.

The switching device 1 has a simple and robust structure, which is particularly adapted to be integrated in a LV or MV switchgear.

The switching device 1 is particularly simple and cheap to manufacture at industrial level.

The invention claimed is:

1. A switching device for low or medium voltage electric power distribution networks, said switching device comprising:
at least an electric pole comprising a movable contact and a fixed contact, which are coupleable/decoupleable one to another, wherein the fixed contact is electrically connected with a pole terminal that is electrically connectable with a corresponding electric phase of the electric power distribution network;
a circuit assembly, which comprises a chain of semiconductor devices adapted to switch in an ON state or in an OFF state depending on the voltage applied thereto, said semiconductor devices being electrically connected in series one to another in such a way that a current (ILOAD) can flow according to a predefined conduction direction when said semiconductor devices are in an ON state;
wherein said circuit assembly comprises an input terminal, an output terminal and one or more intermediate terminals;
wherein each of said intermediate terminals is electrically connected with a corresponding electric node positioned between two subsequent semiconductor devices;
wherein said input terminal is electrically connected with said fixed contact;
wherein said input terminal, said output terminal and said intermediate terminals are electrically coupleable/decoupleable with/from said movable contact when said movable contact reaches different positions during a movement towards/away from said fixed contact in such a way that different groups of semiconductor devices switch in an ON state or in an OFF state at different instants during the movement of said movable contact, depending on the position reached by said movable contact.

2. The switching device, according to claim 1, wherein said circuit assembly comprises a single intermediate terminal electrically connected with a corresponding intermediate electric node positioned between two subsequent semiconductor devices;
wherein said chain of semiconductor devices comprises a first group of semiconductor devices electrically connected in series between said input terminal and said intermediate terminal, and a second group of semiconductor devices electrically connected in series between said intermediate terminal and said output terminal;
wherein said input terminal, said output terminal and said intermediate terminal are electrically coupleable/decoupleable with/from said movable contact when said movable contact reaches different positions during a movement towards/away from said fixed contact in such a way that said first and second groups of semiconductor devices switch in an ON state or in an OFF state at different instants during the movement of said movable contact, depending on the position reached by said movable contact.

3. The switching device, according to claim 2, wherein during a movement towards/from said fixed contact said movable contact reaches:
a first position, in which said movable contact is electrically coupled with said fixed contact and with said input, output and intermediate terminals;
a second position, in which said movable contact is electrically decoupled from said fixed contact and from said input terminal and is electrically coupled with said output and intermediate terminals;
a third position, in which said movable contact is electrically decoupled from said fixed contact and from said input and intermediate terminals and is electrically coupled with said output terminal;
a fourth position, in which said movable contact is electrically decoupled from said fixed contact and from said input, output and intermediate terminals.

4. The switching device, according to claim 3, wherein during a movement of said movable contact away from said fixed contact:
said first and second groups of semiconductor devices are in an OFF state, when said movable contact is said first position;
said first group of semiconductor devices switches in an ON state when said movable contact has reached said second position, said second group of semiconductor devices remains in an OFF sate, when said movable contact has reached said second position;

said first group of semiconductor devices remains in an ON state when said movable contact has reached said third position, said second group of semiconductor devise switches in an ON state, when said movable contact has reached said third position;

said first and second groups of semiconductor devices switch in an OFF state, when said movable contact has reached said fourth position.

5. The switching device, according to claim 3, wherein during a movement of said movable contact towards said fixed contact:

said first and second groups of semiconductor devices are in an OFF state, when said movable contact is said fourth position;

said first group of semiconductor devices switches in an ON state when said movable contact has reached said third position, said second group of semiconductor devices switches in an ON state, when said movable contact has reached said third position;

said first group of semiconductor devices remains in an ON state when said movable contact has reached said second position, said second group of semiconductor devices switches in an OFF state, when said movable contact has reached said second position;

said first and second groups of semiconductor devices switch in an OFF state, when said movable contact has reached said first position.

6. The switching device, according to claim 1, wherein said circuit assembly comprise a plurality of intermediate terminals, each of which is electrically connected with a corresponding intermediate electric node positioned between two subsequent semiconductor devices;

wherein said input terminal, said output terminal and said intermediate terminals are electrically coupleable/decoupleable with/from said movable contact when said movable contact reaches different positions during a movement towards/away from said fixed contact, so that said different groups of semiconductor devices switch in an ON state or in an OFF state at different instants during the movement of said movable contact, depending on the position reached by said movable contact.

7. The switching device according to claim 1, wherein said at least an electric pole comprises first electric connection means to electrically connect said input terminal with said fixed contact.

8. The switching device, according to claim 7, wherein said first electric connection means comprise a conductive base, on which said fixed contact is mounted and first fixing means for connecting said input terminal with said conductive base.

9. The switching device, according to claim 1, wherein said at least an electric pole comprises second electric connection means to electrically connect said output terminal with said movable contact.

10. The switching device, according to claim 9, wherein said second electric connection means comprise a first conductive plate having a first through hole, a first sliding contact ring coupled with said first conductive plate at said first through hole and second fixing means for connecting said output terminal with said first conductive plate.

11. The switching device, according to claim 1, wherein said at least an electric pole comprises third electric connection means to electrically connect said one or more intermediate terminals with said movable contact.

12. The switching device, according to claim 11, wherein said third electric connection means comprise one or more second conductive plates, each of which has a second through hole, one or more second sliding contact rings, each of which is coupled with a corresponding second conductive plate at said second through hole, and third fixing means for connecting each intermediate terminal with a corresponding second conductive plate.

13. The switching device, according to claim 1, wherein said circuit assembly comprises a printed circuit board on which said semiconductor devices are mounted, said input, output and intermediate terminals being fixed to said printed circuit board.

14. The switching device, according to claim 13, wherein said printed circuit board has a flexible structure that can be folded in a rolled position, said circuit assembly comprising an insulating case configured to accommodate said flexible printed circuit board in a rolled position.

15. A switchgear comprising at least a switching device according to claim 1.

16. The switching device, according to claim 4, wherein during a movement of said movable contact towards said fixed contact:

said first and second groups of semiconductor devices are in an OFF state, when said movable contact is said fourth position;

said first group of semiconductor devices switches in an ON state when said movable contact has reached said third position, said second group of semiconductor devices switches in an ON state, when said movable contact has reached said third position;

said first group of semiconductor devices remains in an ON state when said movable contact has reached said second position, said second group of semiconductor devices switches in an OFF state, when said movable contact has reached said second position;

said first and second groups of semiconductor devices switch in an OFF state, when said movable contact has reached said first position.

17. The switching device according to claim 2, wherein said at least an electric pole comprises first electric connection means to electrically connect said input terminal with said fixed contact.

18. The switching device, according to claim 2, wherein said at least an electric pole comprises second electric connection means to electrically connect said output terminal with said movable contact.

19. The switching device, according to claim 2, wherein said at least an electric pole comprises third electric connection means to electrically connect said one or more intermediate terminals with said movable contact.

20. The switching device, according to claim 2, wherein said circuit assembly comprises a printed circuit board on which said semiconductor devices are mounted said input, output and intermediate terminals being fixed to said printed circuit board.

* * * * *